(12) United States Patent
Kim

(10) Patent No.: US 11,940,473 B2
(45) Date of Patent: Mar. 26, 2024

(54) APPARATUS AND METHOD FOR COMPENSATING FOR OFFSET IN SWITCHING CURRENT SENSING

(71) Applicant: HYUNDAI MOBIS Co., Ltd., Seoul (KR)

(72) Inventor: Sang Min Kim, Yongin-si (KR)

(73) Assignee: HYUNDAI MOBIS CO., LTD., Seoul (KR)

(*) Notice: Subject to any disclaimer, the term of this patent is extended or adjusted under 35 U.S.C. 154(b) by 243 days.

(21) Appl. No.: 17/540,645

(22) Filed: Dec. 2, 2021

(65) Prior Publication Data
US 2022/0170965 A1    Jun. 2, 2022

(30) Foreign Application Priority Data
Dec. 2, 2020 (KR) .................. 10-2020-0167073

(51) Int. Cl.
G01R 15/18 (2006.01)
G01R 19/25 (2006.01)
H02M 1/00 (2006.01)
H02P 27/06 (2006.01)

(52) U.S. Cl.
CPC ....... *G01R 19/2506* (2013.01); *G01R 15/181* (2013.01); *H02M 1/0009* (2021.05); *H02P 27/06* (2013.01)

(58) Field of Classification Search
CPC .... H02M 1/00; H02M 1/0009; G01R 15/181; G01R 19/2506; G01R 31/00
See application file for complete search history.

(56) References Cited

U.S. PATENT DOCUMENTS

| | | | |
|---|---|---|---|
| 6,377,037 B1* | 4/2002 | Burns ................ | G01R 21/133 324/142 |
| 6,829,152 B2* | 12/2004 | Miura ................ | H02M 1/08 327/434 |
| 6,885,183 B2* | 4/2005 | Kato ................ | G01R 15/181 324/117 R |
| 6,975,951 B1* | 12/2005 | Sutrave ............ | G01R 35/00 324/76.12 |

(Continued)

FOREIGN PATENT DOCUMENTS

| AU | 2002362627 A1 * | 4/2003 | ............ G01R 1/203 |
|---|---|---|---|
| CN | 201138592 Y * | 10/2008 | |

(Continued)

*Primary Examiner* — Sisay G Tiku
(74) *Attorney, Agent, or Firm* — Morgan, Lewis & Bockius LLP (57) ABSTRACT

The present disclosure relates to an apparatus and method for compensating for an offset in switching current sensing in an improved method using a Rogowski coil and an Op-amp. According to the present disclosure, when a Rogowski current sensor and an Op-Amp integrator are used to sense a switching current of a motor driving inverter, a DC-DC converter, or the like, the fact that an offset value of an output of the integrator varies depending on a duty value of a pulse-width modulation (PWM) control signal is used, so that offset calibration software is applied to automatically generate an offset value table at the beginning of power up of a controller and compensate for a sensed value of the current in real time by referring to the value. As a result, there is no need to perform conventional manual tuning.

10 Claims, 8 Drawing Sheets

(56) References Cited

U.S. PATENT DOCUMENTS

| | | | | |
|---|---|---|---|---|
| 7,598,724 | B2* | 10/2009 | Howell | G01R 15/181 |
| | | | | 324/127 |
| 2011/0156698 | A1* | 6/2011 | Cook | G01R 15/185 |
| | | | | 324/127 |
| 2012/0098556 | A1* | 4/2012 | Miyazaki | G01R 13/02 |
| | | | | 324/750.01 |
| 2021/0028712 | A1* | 1/2021 | Yu | H01F 30/16 |
| 2023/0223838 | A1* | 7/2023 | Fernandez-Mattos | |
| | | | | H02M 1/0009 |
| | | | | 363/65 |

FOREIGN PATENT DOCUMENTS

| | | | | |
|---|---|---|---|---|
| CN | 101603980 | A * | 12/2009 | |
| CN | 102067432 | A * | 5/2011 | H02M 7/48 |
| CN | 102878917 | A * | 1/2013 | |
| CN | 206594219 | U * | 10/2017 | |
| CN | 112730944 | A * | 4/2021 | G01R 15/181 |
| CN | 113917277 | A * | 1/2022 | |
| CN | 217824912 | U * | 11/2022 | |
| DE | 102008018075 | A1 * | 10/2009 | H02M 7/53875 |
| EP | 2444816 | A2 * | 4/2012 | G01R 13/02 |
| JP | 2008061327 | A * | 3/2008 | H02P 27/08 |
| WO | WO-03032478 | A1 * | 4/2003 | G01R 1/203 |
| WO | WO-2011036896 | A1 * | 3/2011 | H02M 7/53875 |
| WO | WO-2012022970 | A2 * | 2/2012 | H02P 25/026 |
| WO | WO-2021066153 | A1 * | 4/2021 | |

* cited by examiner

APPARATUS AND METHOD FOR COMPENSATING FOR OFFSET IN SWITCHING CURRENT SENSING

CROSS-REFERENCE TO RELATED APPLICATION

This application claims the benefit under 35 U.S.C. § 119(a) of Korean Patent Application No. 10-2020-0167073, filed on Dec. 2, 2020 in the Korean Intellectual Property Office, the entire disclosure of which is incorporated herein by reference for all purposes.

BACKGROUND

1. Technical Field

The present disclosure relates to a technique for sensing a switching current of a power semiconductor (e.g., a metal oxide semiconductor field-effect transistor (MOSFET)) in a motor driving inverter, a DC-DC converter, and the like, and a technique for compensating for an offset generated at the time of sensing the switching current.

2. Discussion of Related Art

In order to sense or measure a switching current of a power semiconductor (e.g., a metal oxide semiconductor field-effect transistor (MOSFET)) used as a switching element in a motor driving inverter, a DC-DC converter, and the like for an electric vehicle, conventionally, a magnetic sensor (e.g., Hall sensor) using a magnet core has been used. In the case of the magnetic sensor, a magnetic flux is saturated due to the magnet core, and when sensing a high current, the size of the Hall sensor is likely to be increased, and accordingly, prices rise.

Figure 1:
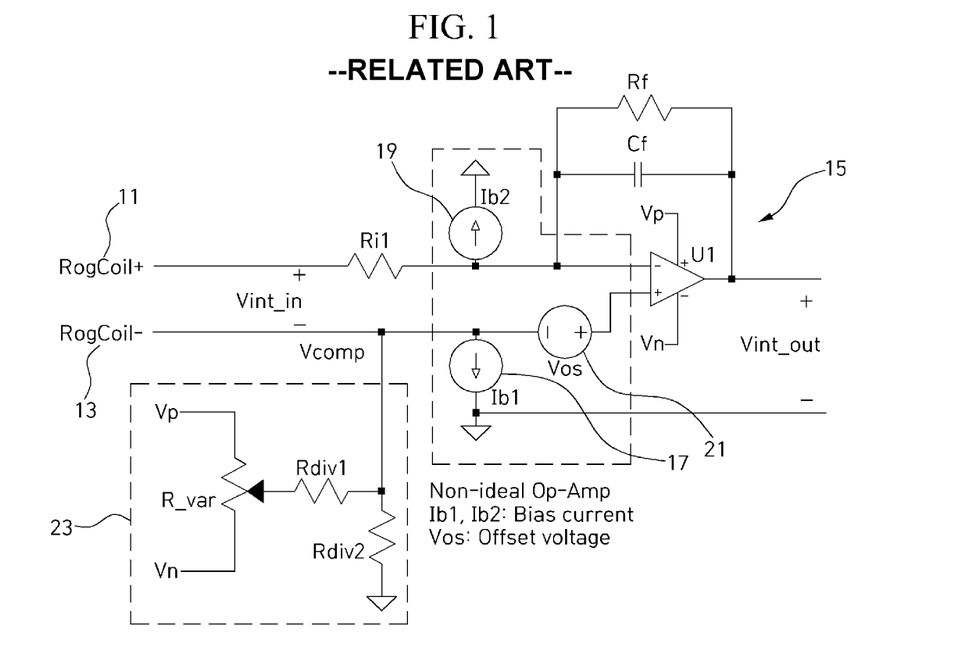
FIG. 1 is a circuit diagram of a switching current sensing circuit using Rogowski coils (11 and 13) and an Op-Amp (an operational amplifier) integrator (15) according to the related art.

Further, due to those problems, conventionally, a switching current sensing method using Rogowski coils 11 and 13 and an operational amplifier (Op-Amp) integrator 15 shown in FIG. 1 has also been used. In this manner, since a magnet core is not used, there is no magnetic flux saturation problem, and thus, it is advantageous in terms of size and price as compared with an existing Hall sensor method even when a high current is sensed. However, an offset voltage and a bias current are present in a non-ideal Op-Amp, and because of this, a current sensing error is accumulated in an integration operation of the Op-Amp, and thus an offset occurs in an output of an integrator. Generally, a reset is applied every switching period so that an offset integrated value is not accumulated, but the offset is still included in the integrated value in a period at which the integration is performed.

FIG. 1 illustrates bias currents Ib1 17 and Ib2 19 and an offset voltage Vos 21 present in an Op-Amp integrator. The offset voltage Vos ranges from several hundred μV to several mV and the range is different depending on an Op-Amp. In order to minimize an offset in an output of an Op-Amp integrator 15, manual tuning using an offset compensation network was conventionally applied. An offset compensation network 23 for manual tuning is illustrated in FIG. 1. The output of the integrator 15 is set to be zero by manually tuning a movable electrode of a variable resistor R_var (e.g., R=10 kΩ) to which voltages of $V_p$=+5V and $V_n$=−5V obtained by partially extracting (e.g., Vcomp÷0.95 mV) an integrator input voltage $V_{int\_in}$, which is input from Rogowski coils 11 and 13, through distribution resistors $R_{div1}$ and $R_{div2}$ are applied to both end electrodes. That is, using the principle of superposition, a compensation value is calculated and a parameter value is designed. However, the disadvantages of such manual tuning are 1) an increase in labor costs, and 2) inability to respond to offset changes due to component deterioration.

SUMMARY

The present disclosure is directed to providing a method and apparatus for compensating for an offset in switching current sensing in an improved method using a Rogowski coil and an Op-Amp.

In order to achieve the above-described objective, when a Rogowski current sensor and an Op-Amp integrator are used to sense a switching current of a motor driving inverter, a DC-DC converter, or the like, the fact that an offset value of an output of the integrator varies depending on a duty value of a pulse-width modulation (PWM) control signal is used so that offset calibration software is applied to automatically generate an offset value table at the beginning of power up of a controller and compensate for a sensed value of the current in real time by referring to the value. As a result, there is no need to perform conventional manual tuning.

Specifically, according to an aspect of the present disclosure, there is provided an apparatus for compensating for an offset in switching current sensing, the apparatus including a Rogowski coil configured to detect a switching current flowing through switching elements to output a differentiated value, an integrator configured to integrate the differentiated value received from the Rogowski coil, a reset circuit configured to apply a reset signal for each switching period so that an offset integrated value is not accumulated when the integrator performs integration, a subtractor configured to receive an output value of the integrator, perform a phase current reconstruction function to derive a voltage value corresponding to a phase current, and output the voltage value as a current sensing signal, and a controller configured to receive the current sensing signal from the subtractor, process the signal using offset calibration software, and compensate for an offset of the current sensing signal in real time.

According to another aspect of the present disclosure, there is provided a method for compensating for an offset in switching current sensing, the method including: receiving a current sensing signal from a phase current reconstruction unit configured to receive an output value of an integrator, which is configured to integrate a differentiated value received from a Rogowski coil configured to detect a switching current flowing through switching elements to output the differentiated value, perform a phase current reconstruction function to derive a voltage value corresponding to a phase current, and output the voltage value as the current sensing signal; processing the signal using offset calibration software; and compensating for an offset of the current sensing signal in real time.

According to still another aspect of the present disclosure, there are provided a switching controller configured to perform the method and a computer recording medium in which the offset calibration software is recorded.

The above-described configurations and operations of the present disclosure will become more apparent from embodiments described in detail below with reference to the drawings.

BRIEF DESCRIPTION OF THE DRAWINGS

The above and other objects, features, and advantages of the present disclosure will become more apparent to those of ordinary skill in the art by describing exemplary embodiments thereof in detail with reference to the accompanying drawings, in which.

DETAILED DESCRIPTION OF EXEMPLARY EMBODIMENTS

Advantages and features of the present disclosure and methods for achieving them will be made clear from embodiments described in detail below with reference to the accompanying drawings. However, the present disclosure may be implemented in many different forms and should not be construed as being limited to the embodiments set forth herein. Rather, these embodiments are provided so that this disclosure will be thorough and complete and will fully convey the scope of the present disclosure to those of ordinary skill in the technical field to which the present disclosure pertains. The present disclosure is defined by the claims. Meanwhile, terms used herein are for the purpose of describing the embodiments and are not intended to limit the present disclosure. As used herein, the singular forms include the plural forms as well unless the context clearly indicates otherwise. The term "comprise" or "comprising" used herein does not preclude the presence or addition of one or more other elements, steps, operations, and/or devices other than stated elements, steps, operations, and/or devices. Hereinafter, exemplary embodiments of the present disclosure will be described in detail with reference to the accompanying drawings. Further, in describing the present disclosure, the detailed description of a related known configuration or function will be omitted when it obscures the gist of the present disclosure.

Figure 2:
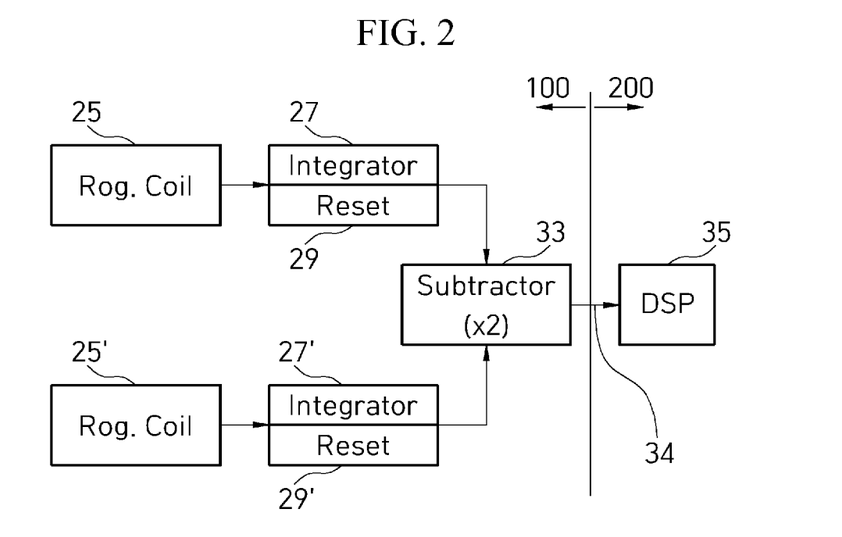
FIG. 2 is a simplified configuration diagram of one embodiment of an apparatus for compensating for an offset in switching current sensing according to the present disclosure.

FIG. 2 is a simplified configuration diagram of one embodiment of an apparatus for compensating for an offset in switching current sensing according to the present disclosure. In the following description, it is assumed that a target of the switching current sensing is a three-phase inverter for driving a three-phase motor. First, each component will be schematically described with reference to FIG. 2.

(1) One set of Rogowski coils 25 and 25' senses each of switching currents passing through a top switch and a bottom switch of an inverter, and transmits a differential value ($v_{didt}=M*di_{sw}/dt$) of the sensed current.

(2) One set of integrators 27 and 27' and one set of reset circuits 29 and 29' are integrators using an Op-Amp and reset signal generating circuits, respectively, integrate the differentiated value received from the Rogowski coils 25 and 25', and apply a reset for each switching period so that an offset integrated value is not accumulated during integration.

(3) A subtractor 33 is a subtraction circuit using an Op-Amp, and derives a voltage value corresponding to a phase current by performing a phase current reconstruction function to output a current sensing signal 34 (an analog signal). A detailed operation of the phase current reconstruction will be described below. The components of (1), (2), and (3), that is, the Rogowski coils 25 and 25', the integrators 27 and 27', and the subtractor 33 configure a switching current sensing unit 100 of the present disclosure.

(4) A digital signal processor (DSP) 35 receives the analog current sensing signal (voltage value) from a phase current reconstruction unit, that is, the subtractor 33 of the switching current sensing unit 100 and compensates for the offset in real time by performing signal processing using offset calibration software according to the present disclosure. That is, the DSP 35 configures an offset compensator 200 of the present disclosure.

Hereinafter, each component will be described in detail.

Figure 3:
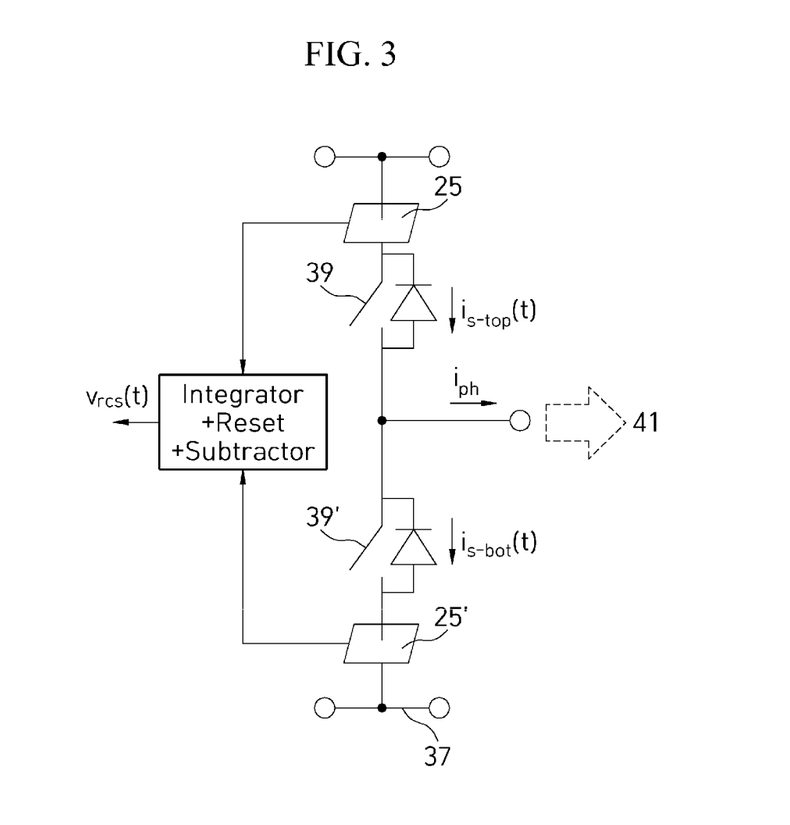
FIG. 3 is a view for describing that the apparatus for compensating for an offset in switching current sensing illustrated in FIG. 2 is installed in each leg of three legs of a three-phase inverter.

FIG. 3 is a view for describing that the apparatus for compensating for an offset in switching current sensing illustrated in FIG. 2 is installed in each leg of three legs of the three-phase inverter. FIG. 3 illustrates the Rogowski coils 25 and 25' configured to sense the switching current passing through a top switch 39 and a bottom switch 39' of one leg 37 of the legs of the three-phase inverter and output a differentiated value and the integrators 27 and 27', the reset circuits 29 and 29', and the subtractor 33 that are configured to receive the differentiated value from each of the Rogowski coils 25 and 25' and process the received differentiated value. The output value of the subtractor 33, that is, a current sensing signal $V_{rsc}(t)$ finally output from the switching current sensing unit 100, is input to the DSP 35, which is the offset compensator 200, and is offset-compensated.

A current $I_{ph}$ (phase current) output from one leg 37 shown in FIG. 3 is transmitted to one phase of a three-phase motor 41 to drive the motor. Accordingly, it will be appreciated in FIG. 3 that the apparatus for compensating for an offset in switching current sensing according to the present disclosure acts to compensate for the offset by sensing the switching current flowing through the legs of the inverter.

Figure 4:
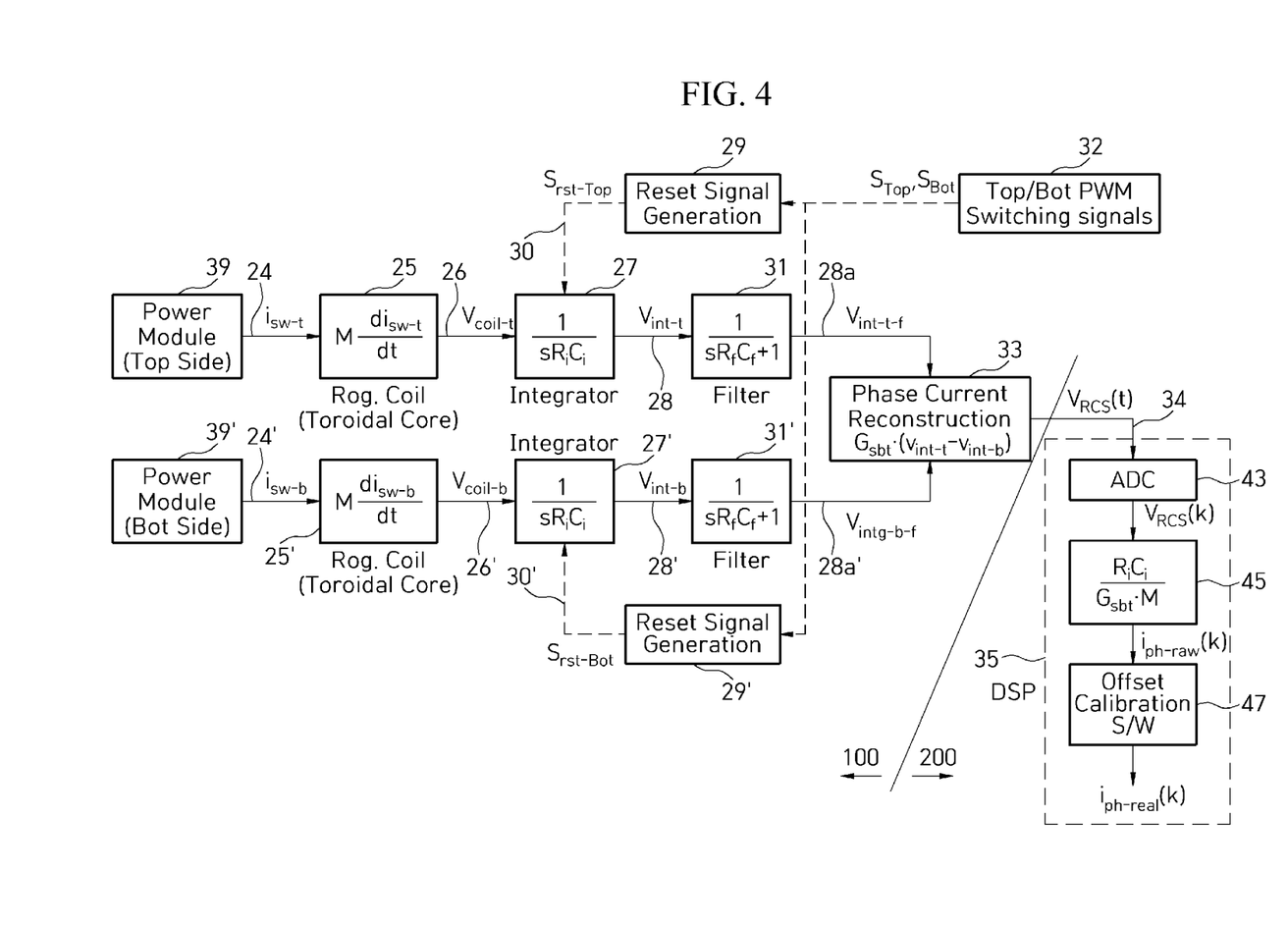
FIG. 4 is a detailed configuration diagram of the apparatus for compensating for an offset in switching current sensing according to the present disclosure.

FIG. 4 is a detailed configuration diagram of the apparatus for compensating for an offset in switching current sensing according to the present disclosure. As shown in FIG. 4, when the Rogowski coils 25 and 25' respectively detect currents 24 and 24' flowing through lines of the top switch 39 and the bottom switch 39' of a power module (i.e., the inverter) and output differentiated values 26 and 26', the integrators 27 and 27' perform integration to output integrated values 28 and 28'. In order to apply a reset for each switching period so that an offset integrated value is not accumulated when the integrators 27 and 27' perform integration, the reset circuits 29 and 29' receive top/bottom pulse-width modulation (PWM) switching signals 32 from a controller (e.g., microcomputer) and generate top-side and bottom-side reset signals 30 and 30' to provide the reset signals 30 and 30' to the integrators 27 and 27', respectively. As described above, the subtractor 33 is a subtraction circuit using an Op-Amp, and performs the phase current reconstruction to output the Rogowski current sensing signal 34.

Since the Rogowski current sensing signal 34, which is an output value of the switching current sensing unit 100, is an analog voltage value, the offset compensator 200, that is, the DSP 35, which receives the Rogowski current sensing signal 34, samples the current sensing signal using an analog-to-digital (AD) converter 43 to perform digital signal processing, converts the sampled current sensing signal into a digital signal, and scales the digital signal using a scaler 45. The scaling is a function of converting output values $V_{int-t}$ and $V_{int-b}$ of the integrators 27 and 27' into current values. Subsequently, an offset table is generated using offset calibration software 47, and the offset is compensated for using the table in real time.

Meanwhile, referring to FIG. 4, filters 31 and 31' are added between the subtractor 33 and the integrators 27 and 27' of the switching current sensing unit 100. The filters 31 and 31' are provided for noise removal.

Figure 5:
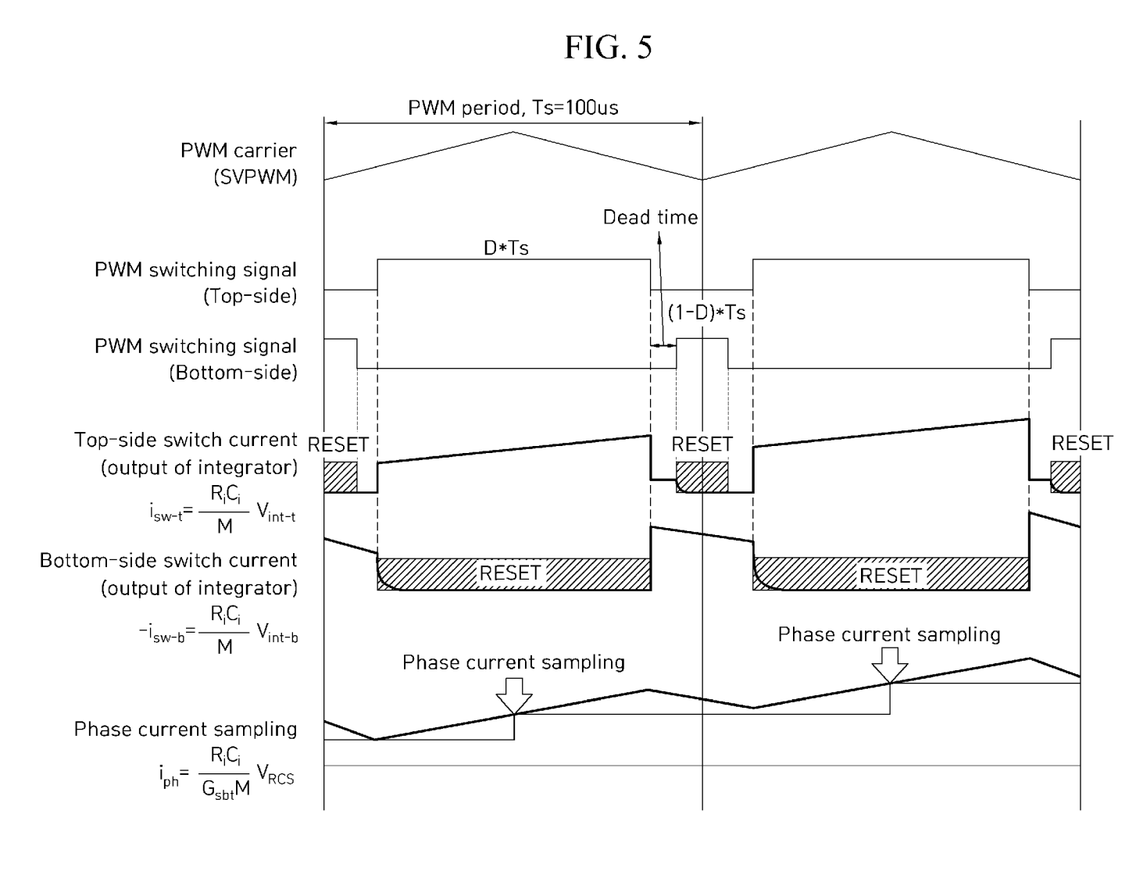
FIG. 5 is an operation timing chart for describing a phase current reconstruction function.

The phase current reconstruction of the subtractor 33 of the switching current sensing unit 100 will be described below with reference to FIGS. 4 and 5. FIG. 5 is an operation timing chart for describing a phase current reconstruction function. The subtractor 33 performs a subtraction operation, using an Op-Amp, on an output of each of the integrators 27 and 27' obtained by sensing the currents flowing through the top/bottom switches 39 and 39' by the current sensors 25 and 25' (i.e., Rogowski coils) and integrating the currents, thereby deriving a voltage value corresponding to a phase current. The resultant value of the subtraction operation is $v_{RCS}(t)=v_{int-t}(t)-v_{int-b}(t)$ (where, RCS is a Rogowski coil current sensor).

This will be described in more detail with reference to the timing chart of FIG. 5. FIG. 5 illustrates a timing relationship diagram of a switching signal, a switch current (the output of the integrator), and a motor phase current of two switching elements (the top switch and the bottom switch, see FIG. 3) included in one of u-phase, v-phase, and w-phase legs of the three-phase inverter.

FIG. 5 illustrates waveforms of a top-side switch current (output of the integrator) (d) and a bottom-side switch current (output of the integrator) (e) respectively (see FIG. 3) according to a top-side PWM switching signal (b) and a bottom-side PWM switching signal (c) that are carried on a PWM carrier (a) and output by the controller during a PWM period (in the case of FIG. 5, $T_S$=100 μsec=10 kHz). Here, the bottom-side PWM switching signal (c) is complementarily output with the top-side PWM switching signal (b), and turned on during a (1−D)*Ts period after an ON period (D*Ts) of the top-side PWM switching signal (b) and a predetermined dead time have passed. In addition, according to these PWM switching signals, the switch current (the output of the integrator) (d) flowing through the top-side switching element 39 (see FIG. 3) is $$i_{SW-t} = \frac{R_i C_i}{M} v_{int-t},$$

and the switch current (output of the integrator) (e) flowing through the bottom-side switching element 39' (see FIG. 3) is $$-i_{SW-b} = \frac{R_i C_i}{M} v_{int-b}.$$

Finally, a reconstructed motor phase current (f) (=$I_{ph}$ in FIG. 3)

$$i_{ph} = \frac{R_i C_i}{G_{sbt} M} v_{RCS}$$

is output from the corresponding leg.

The motor phase current (f) $I_{ph}$ is then A/D converted by the AD convertor 43 and scaled by the scaler 45 for the offset compensation by the DSP 35. Sampling is performed by the DSP 35 for the AD conversion (43), which is illustrated in FIG. 5 together with the phase current sampling waveform.

Meanwhile, FIG. 5 illustrates an operation of applying a reset for each switching period by the reset circuits 29 and 29' so that an offset integrated value is not accumulated on the top-side/bottom-side integrators 27 and 27'. The top-side reset signal 30 (see FIG. 4) is provided to the top-side integrator 27 at the timing of an ON period of the bottom-side PWM switching signal (c), and the bottom-side reset signal 30' (see FIG. 4) is provided to the bottom-side integrator 27' at the timing of an ON period of the top-side PWM switching signal (b).

Next, offset calibration S/W (offset calibration software configured to generate a current sensor offset table and compensate for an offset of an output value of the integrator in real time) in the DSP 35 which is the offset compensator 200 will be described.

In order to compensate for the offset by software, the DSP 35 converts (43) the analog current sensing signal 34 output from the switching current sensing unit 100 into a digital signal, and performs scaling (45) to generate a current value of $$i_{ph-raw}(k) = \frac{R_i C_i}{G_{sbt} M} v_{RCS}(k),$$

where $$v_{RCS}(k) = v_{RCS}(t)\big|_{t=\frac{T_S}{2}}$$

(refer to FIG. 4). The scaling is described above as an operation of converting an output value of an integrator into a current value.

Figure 6:
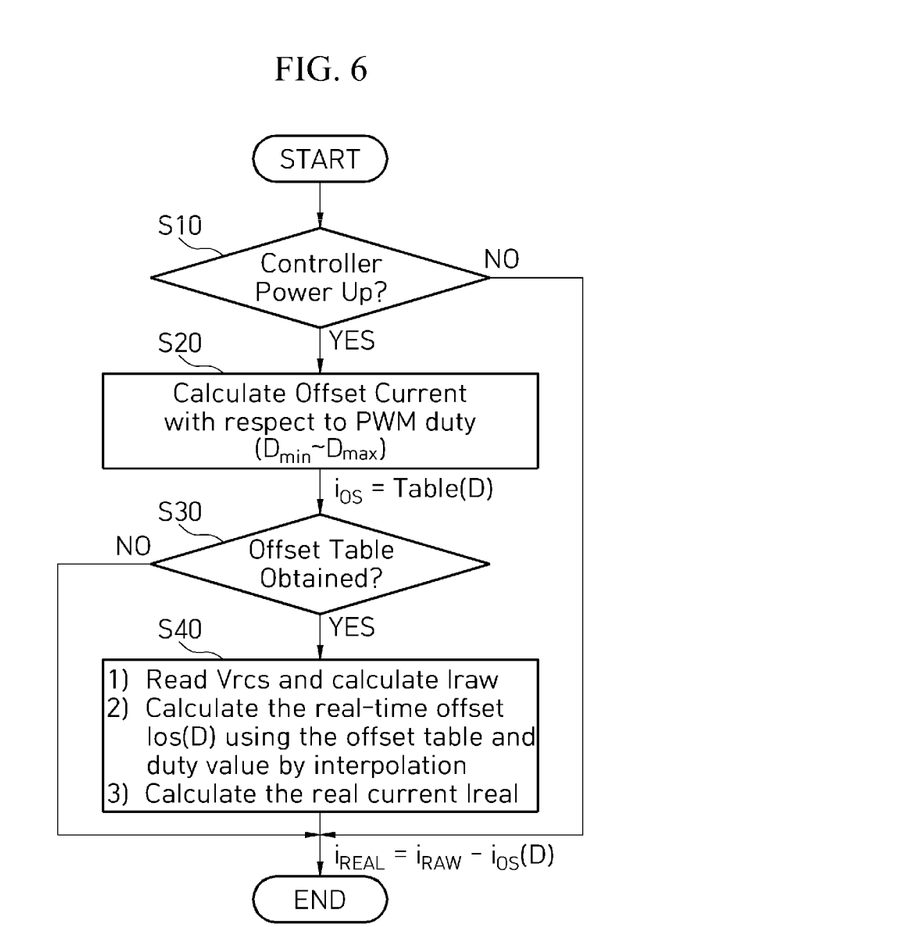
FIG. 6 is an overall processing flowchart of offset calibration software according to the present disclosure.

FIG. 6 is an overall processing flowchart of the offset calibration software according to the present disclosure.

Generally, processes of generating an offset table by sensing an offset of a Rogowski current sensor at a time point of power on of a controller or a microcomputer (DSP), and calculating a compensation current $I_{real}$ by subtracting an offset value $I_{os}$ from a current sensor value $I_{raw}$ read through an ADC are performed. The compensation current is reflected in real time to a PWM control of an inverter for driving a motor.

Figure 7:
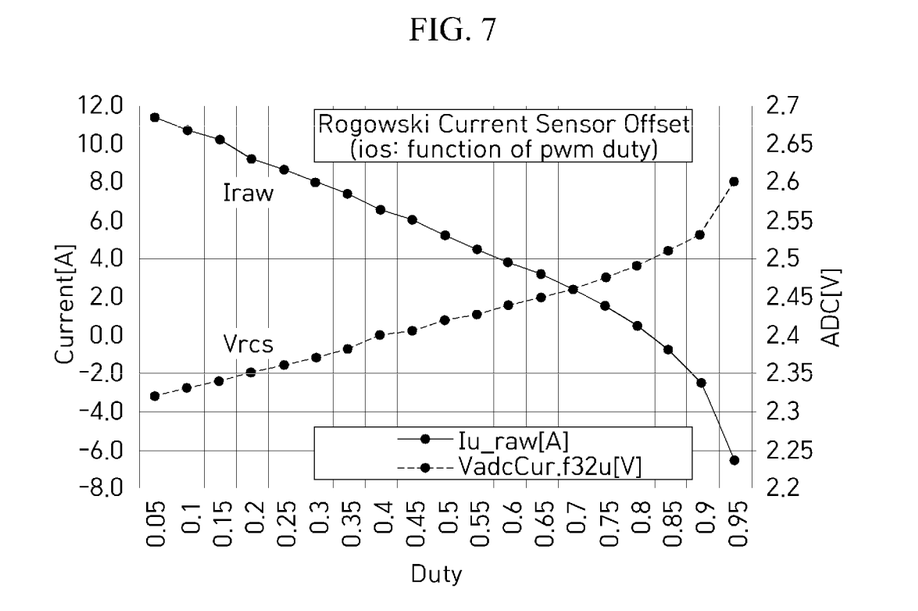
FIG. 7 is a graph illustrating a characteristic in which an input voltage (an output voltage ($V_{rcs}$) of a Rogowski current sensor) of a digital signal processor (DSP) increases as a duty increases, and accordingly, a current ($I_{raw}$) after scaling decreases.

In detail, when power is applied to the controller, that is, a DSP 35 (S10), the offset current $I_{os}$ included in a current from a minimum duty $D_{min}$ (where the duty is a value between 0 and 1) to a maximum duty $D_{max}$ of a PWM signal is calculated (S20). In addition, the offset table in which the offset current for each duty of the PWM signal is mapped is generated (S30). The reason why the offset table is generated based on the duty of the PWM signal is that the offset current $I_{os}$ is a function of the duty of the PWM signal. This will be described with reference to FIG. 7. FIG. 7 is a graph illustrating a characteristic in which an input voltage (an output voltage $V_{rcs}$ of the Rogowski current sensor) of the DSP increases as the duty increases, and accordingly, the current $I_{raw}$ after scaling decreases. With this characteristic, the offset table is generated based on the duty of the PWM signal. Since it takes a short time of about 30 msec to generate the offset table by the offset calibration software in hardware of the DSP 35, when power is supplied to the controller, that is, the DSP 35, the offset table needs to be generated by default.

As described above, the offset table is generated (S30) and stored, and the current $I_{raw}$ before compensation is calculated by receiving $V_{rcs}$ from the current sensing unit 100, and the offset current $I_{os}(D)$ is calculated in real time using the duty value in the generated offset table. In this case, interpolation is used. In addition, finally, the offset-compensated current $I_{real}$ is calculated. That is, it may be calculated as $I_{real}=I_{raw}-I_{os}$.

Figure 8:
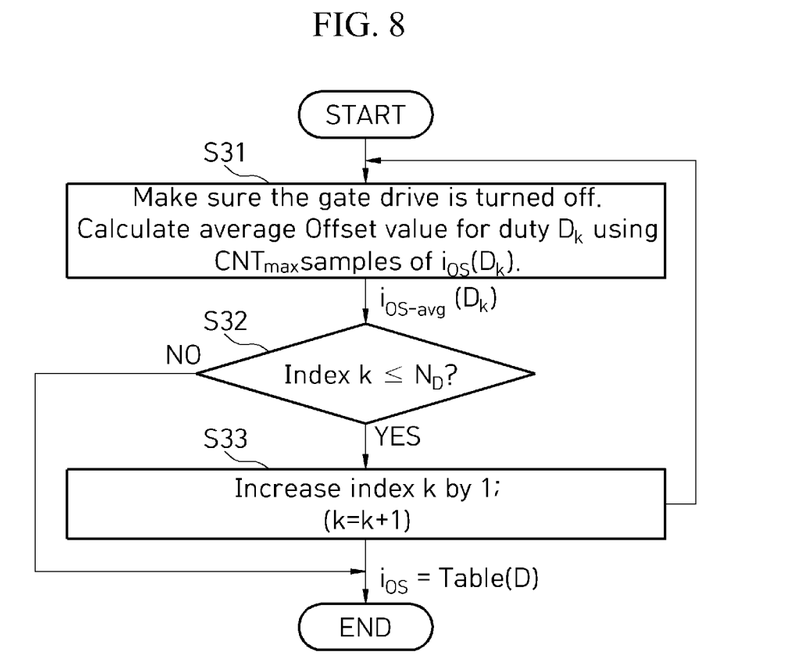
FIG. 8 is a flowchart illustrating an offset table generation operation (S30) during a processing process of FIG. 6.

FIG. 8 illustrates an offset table generation operation (S30) in detail during the processing process of FIG. 6. Before describing the process of FIG. 8, a definition of each parameter will be described first.

$D_{min}$ and $D_{max}$: minimum/maximum value of duty (range: 0 to 1)
$D_k$: arbitrary duty between $D_{min}$ and $D_{max}$. $D_{min}<D_k<D_{max}$
$N_D$: duty count of PWM signal. Thus, $1 \leq k \leq N_D$
$\Delta D$: duty interval when offset table is generated.

$$\Delta D = \frac{D_{max} - D_{min}}{N_D}$$

$CNT_{max}$: sample count for average value calculation.
For example: $D_{min}=0.01$, $D_{max}=0.99$, $N_D=20$, and D=4.9

First, as shown in operation S31, it is confirmed whether a driver configured to provide a driving signal to a gate of a switching element is turned off. This is a procedure for generating an offset table when no current flows in the semiconductor switching element. In this state, an average value of a current sensor offset with respect to an offset current $I_{os}(D_k)$ at a duty $D_k$ is calculated for a sample count $CNT_{max}$. Thus, an average value of $I_{os}$ is calculated as $$i_{OS-avg}(D_k) = \frac{1}{CNT_{max}} \sum_{j=1}^{CNT_{max}} \frac{R_i C_i}{G_{sbt} M} v_{RCS}(j, D_k).$$

The above process proceeds until an index $k \leq N_D$ (S32). When $k \leq N_D$, k is increased by 1 (k=k+1), and operation S31 is performed again to finally generate an offset table $i_{os}$=Table(D).

Figure 9:
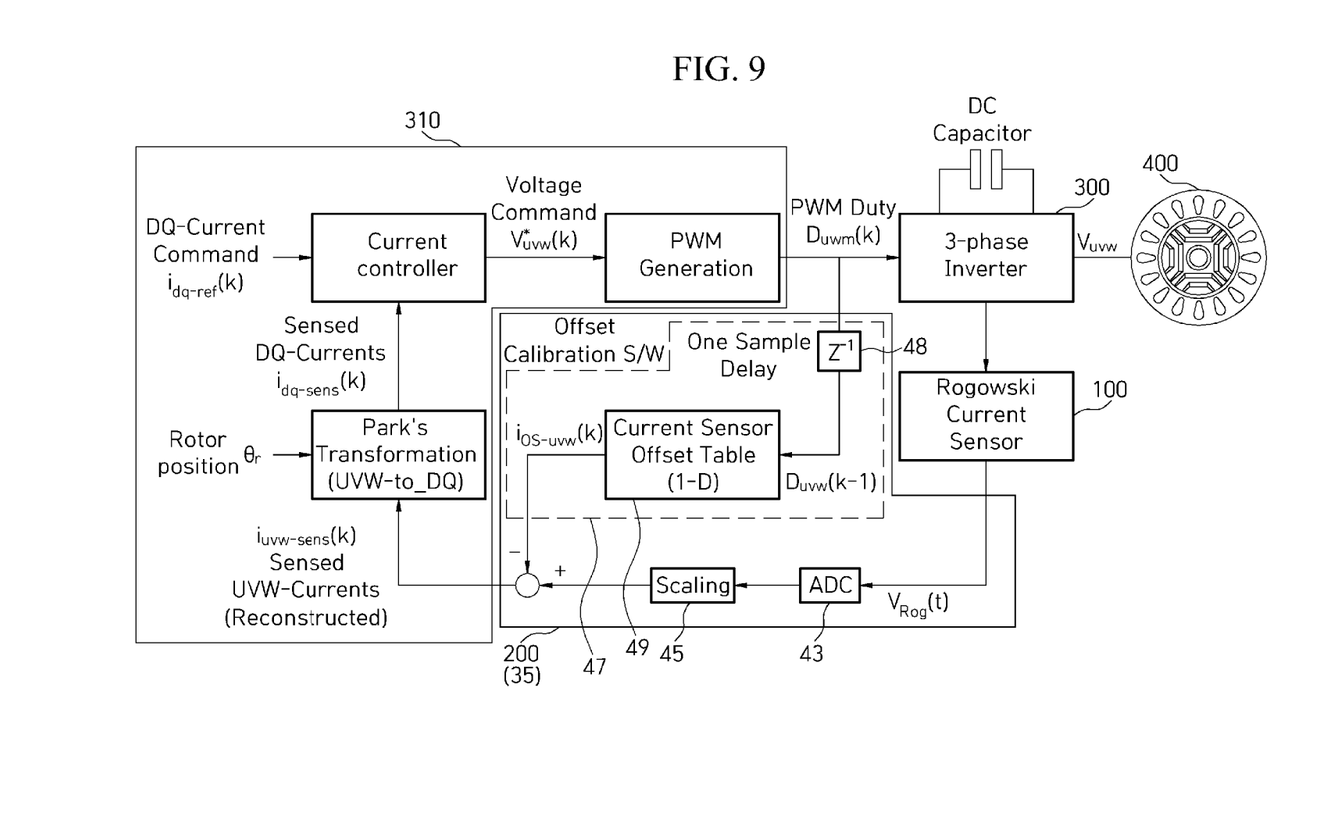
FIG. 9 is a diagram illustrating a case in which offset calibration software (47) of the present disclosure performs a real-time compensation operation.

FIG. 9 concretely illustrates a case in which the offset calibration software 47 in the offset compensator 200 of the present disclosure, that is, the DSP 35 performs real-time compensation in a system including a three-phase inverter 300 and a motor 400 driven by the three-phase inverter 300.

An output value (three phases) of the current sensing unit 100, configured to detect a switching current flowing through each leg of the three-phase inverter 300, is scaled (45) through the AD conversion (43) of the offset compensator 200 to be a current i_Rog-uvw(k). Meanwhile, the offset calibration software 47 calculates an offset current using an offset table 49 generated by using the duty of the PWM signal as described above, and in this case, an offset current $I_{os}$-uvw(k) is calculated by inputting a duty value (1−D) of the PWM before one step to the offset table, that is, delaying one sample (48). In addition, as described above, the offset current is subtracted from the scaled (45) current to calculate $I_{real}(=I_{raw}-I_{os})$, which is reflected in the PWM signal of the three-phase inverter 300. In FIG. 9, block "310" is a configuration generally used for PWM control of the inverter 300, and thus a detailed description thereof will be omitted.

Figure 10:
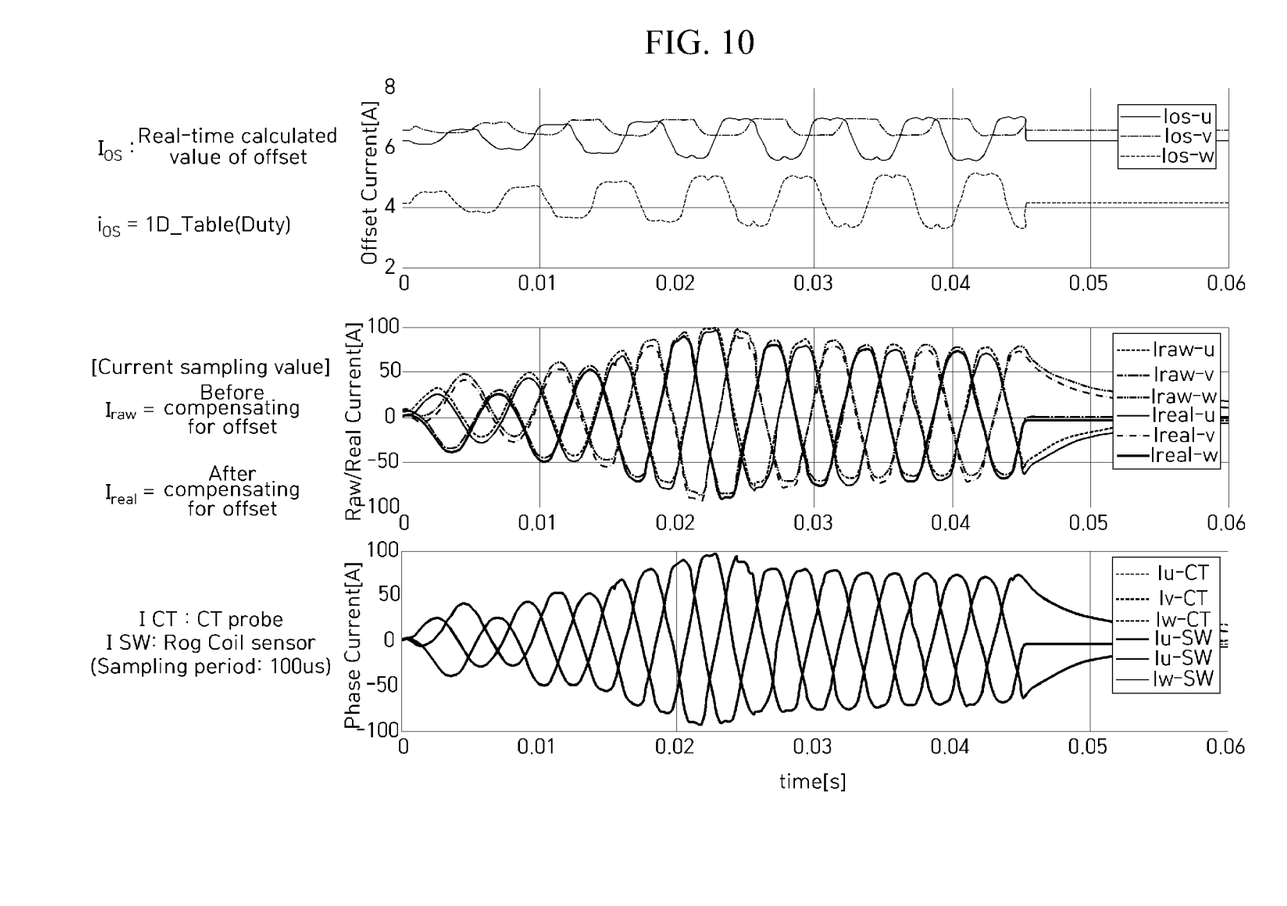
FIG. 10 illustrates a verification result of the present disclosure indicating that an offset is compensated for in real time in a motor system shown in FIG. 9.

FIG. 10 illustrates a verification result of the present disclosure indicating that the offset is compensated for in real time in the motor system shown in FIG. 9.

FIG. 10A illustrates waveforms of $I_{os}$-u, $I_{os}$-v, and $I_{os}$-w, which are real-time calculated values of offsets for each phase of u, v, and w, and FIG. 10B illustrates waveforms for each phase of a current $I_{raw}$ before the offset is compensated for and the current $I_{real}$ after the offset is compensated for. In addition, in FIG. 10C, it can be seen that the offset compensation currents $I_{real}(I_{u-SW}, I_{v-SW},$ and $I_{w-SW})$ for each phase calculated by the present disclosure match currents $I_{u-CT}, I_{v-CT},$ and $I_{w-CT}$ measured by a current probe (CT probe).

The present disclosure may be implemented in terms of apparatus and method, and in particular, a function or process of each component of the present disclosure may be implemented as a hardware element including at least one of a DSP, a processor, a controller, an application-specific integrated circuit (ASIC), a programmable logic element (a field-programmable-gate-array (FPGA) or the like), and other electronic devices, and combinations thereof. Further, the present disclosure may be implemented in software (that is, the offset calibration software) combined with a hardware element or independently, and the software may be stored in a computer recording medium.

According to the present disclosure, following effects may be achieved.
1. Labor costs can be saved because manual tuning is not required.
2. Even when an offset voltage and a bias current of an Op-Amp are changed due to the deterioration of components, an offset in an output of an integrator can be sensed and compensated for accordingly.
3. Costs for a current sensor can be reduced because a magnetic core is not used (most sensors currently being mass-produced are Hall Effect type sensors).
4. Size reduction effects: it is effective in reducing a size of each of a motor driving inverter and a DC-DC converter because a magnetic core is not used.
5. An arm-short or overcurrent phenomenon can be quickly and accurately detected through switching current sensing, thereby protecting power semiconductors.

Although the present disclosure has been described in detail above with reference to the exemplary embodiments, those of ordinary skill in the technical field to which the present disclosure pertains should be able to understand that various modifications and alterations can be made without departing from the technical spirit or essential features of the present disclosure. Therefore, it should be understood that the disclosed embodiments are not limiting but illustrative in all aspects. Further, the scope of the present disclosure is defined not by the above description but by the following claims, and it should be understood that all changes or modifications derived from the scope and equivalents of the claims fall within the scope of the present disclosure.

What is claimed is:

1. An apparatus for compensating for an offset in switching current sensing, the apparatus comprising:
    a Rogowski coil configured to detect a switching current flowing through each of switching elements to output a differentiated value;
    an integrator configured to integrate the differentiated value received from the Rogowski coil;
    a reset circuit configured to apply reset signals for respective switching periods of the switching elements so that an offset integrated value is not accumulated when the integrator performs integration;
    a subtractor configured to receive an output value of the integrator, to perform a phase current reconstruction function, which is a subtraction operation on the output value of the integrator, to derive a voltage value corresponding to a phase current, and to output the voltage value as a current sensing signal; and
    a controller configured to receive the current sensing signal from the subtractor, to process the current sensing signal using an offset calibration software, and to compensate for an offset of the current sensing signal in real time,
    wherein the reset circuit provides a reset signal to the integrator at a timing of an ON period of a pulse-width modulation (PWM) switching signal.

2. The apparatus of claim 1, wherein
    the switching elements include a top switch and a bottom switch of one leg of legs of a three-phase inverter,
    the Rogowski coil includes a first Rogowski coil and a second Rogowski coil configured to detect switching currents passing through the top switch and the bottom switch, respectively, and to output differentiated values,
    the integrator includes a first integrator and a second integrator configured to integrate the differentiated values received from the first and second Rogowski coils, respectively, and
    the reset circuit includes a first reset circuit and a second reset circuit configured to respectively apply a reset operation to the first and second integrators for the respective switching periods of the switching elements so that the offset integrated value is not accumulated when the first and second integrators perform integration.

3. The apparatus of claim 2, wherein the first reset circuit provides a reset signal to the first integrator at a timing of an ON period of a bottom-side PWM switching signal, and the second reset circuit provides a reset signal to the second integrator at a timing of an ON period of a top-side PWM switching signal.

4. The apparatus of claim 1, further comprising a filter located between the integrator and the subtractor and configured to remove noise.

5. The apparatus of claim 1, wherein the controller includes an analog-to-digital (AD) converter configured to sample the current sensing signal and convert the sampled signal into a digital signal, a scaler configured to convert the output value of the integrator into a current value, and a non-transitory computer recording medium storing the offset calibration software that causes, when executed, a digital signal processor associated with a storage medium to generate a current sensor offset table and to compensate for an offset of the output value of the integrator in real time.

6. The apparatus of claim 1, wherein the controller is configured to calculate an offset current from a minimum duty to a maximum duty of a PWM signal to generate an offset table in which an offset current for each duty of the PWM signal is mapped, to calculate a current before compensation from the current sensing signal, to calculate an offset current in real time using a duty value in the generated offset table, and to calculate [(a current before compensation)-(the offset current)] to calculate an offset compensation current.

7. A method for compensating for an offset in switching current sensing, the method comprising:
    receiving a current sensing signal from a phase current reconstruction unit configured to receive an output value of an integrator, which is configured to integrate a differentiated value received from a Rogowski coil configured to detect a switching current flowing through each of switching elements to output the differentiated value, to perform a phase current reconstruction function, which is a subtraction operation on the output value of the integrator, to derive a voltage value corresponding to a phase current, and to output the voltage value as the current sensing signal;
    processing the current sensing signal using an offset calibration software;
    compensating for an offset of the current sensing signal in real time; and
    providing a reset signal to the integrator at a timing of an ON period of a pulse-width modulation (PWM) switching signal.

8. The method of claim 7, wherein the processing the current sensing signal using an offset calibration software includes calculating an offset current from a minimum duty to a maximum duty of a PWM signal to generate an offset table in which an offset current for each duty of the PWM signal is mapped, calculating a current before compensation from the current sensing signal, calculating an offset current in real time using a duty value in the generated offset table, and calculating to calculate an offset compensation current.

9. A switching controller configured to compensate for an offset of a current sensing signal in real time by including a digital signal processor configured to perform signal processing by receiving the current sensing signal from a phase current reconstruction unit configured to receive an output value of an integrator, which is configured to integrate a differentiated value received from a Rogowski coil configured to detect a switching current flowing through each of switching elements to output the differentiated value, to perform a phase current reconstruction function, which is a subtraction operation on the output value of the integrator, to derive a voltage value corresponding to a phase current, and to output the voltage value as the current sensing signal,
    wherein the switching controller is further configured to provide a reset signal to the integrator at a timing of an ON period of a pulse-width modulation (PWM) switching signal.

10. The switching controller of claim 9, wherein the digital signal processor is configured to calculate an offset current from a minimum duty to a maximum duty of a PWM signal to generate an offset table in which an offset current for each duty of the PWM signal is mapped, to calculate a current before compensation from the current sensing signal, to calculate an offset current in real time using a duty value in the generated offset table, and to calculate to calculate an offset compensation current.

\* \* \* \* \*